(12) United States Patent
Araki

(10) Patent No.: US 6,657,295 B2
(45) Date of Patent: Dec. 2, 2003

(54) MULTILAYER INTERCONNECT BOARD AND MULTILAYER SEMICONDUCTOR DEVICE

(75) Inventor: Yasushi Araki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/237,797

(22) Filed: Sep. 10, 2002

(65) Prior Publication Data
US 2003/0067056 A1 Apr. 10, 2003

(30) Foreign Application Priority Data
Sep. 28, 2001 (JP) ........................................ 2001-299022

(51) Int. Cl.[7] ............................................... H01L 23/34
(52) U.S. Cl. ......................................... 257/712; 257/713
(58) Field of Search .................................. 257/712, 713

(56) References Cited
U.S. PATENT DOCUMENTS 4,778,950 A * 10/1988 Lee et al.
5,831,333 A * 11/1998 Malladi et al.
6,323,436 B1 * 11/2001 Hedrick et al.

* cited by examiner

Primary Examiner—Stephen D. Meier
(74) Attorney, Agent, or Firm—Staas & Halsey LLP

(57) ABSTRACT

A multilayer interconnect board comprised of a plurality of stacked cloth-reinforced resin layers with at least one layer of interconnect patterns formed at a stacking interface of the resin layers, wherein either an interconnect pattern is formed at a stacking interface between a bottommost resin layer provided at its bottom surface with lands for bonding with solder balls or other external connection terminals and a directly higher resin layer while avoiding portions corresponding to the lands; a full surface interconnect pattern is formed over substantially the entire surface of a stacking interface between a bottommost resin layer provided at its bottom surface with lands for bonding with solder balls or other external connection terminals and a directly higher resin layer; or no interconnect pattern is formed at a stacking interface between a bottommost resin layer provided at its bottom surface with lands for bonding with solder balls or other external connection terminals and a directly higher resin layer, and thereby not suffering from electrical defects due to disconnection of interconnect patterns due to cracks occurring from nearby lands of a bottommost resin layer of the multilayer semiconductor device when exposed to a thermal cycle in a state mount on a motherboard even when the cracks pass through the bottommost resin layer and reach the directly higher resin layer.

11 Claims, 4 Drawing Sheets

MULTILAYER INTERCONNECT BOARD AND MULTILAYER SEMICONDUCTOR DEVICE

BACKGROUND OF THE INVENTION

1. Field of the Invention

The present invention relates to a multilayer interconnect board and a multilayer semiconductor device, more particularly relates to a multilayer interconnect board comprised of a plurality of stacked cloth-reinforced resin layers and having at least one layer of an interconnect pattern formed at a stacking interface of the resin layers and to a multilayer semiconductor device using that multilayer interconnect board.

2. Description of the Related Art

A conventional multilayer semiconductor device comprised of a stacked plurality of resin layers is shown in FIG. 7. The multilayer semiconductor device 100 is comprised of a multilayer interconnect board A on which a semiconductor chip 112 is carried. The multilayer interconnect board A is formed of three resin layers 104a, 104b, and 104c reinforced by glass cloth 102 as a reinforcing material and is formed with interconnect patterns 106a and 106b at the stacking interface X between the resin layer 104a and resin layer 104b and the stacking interface Y between the resin layer 104b and resin layer 104c.

The resin layer 104a of the bottommost layer of the multilayer interconnect board A has lands 110 formed on its bottom surface for bonding with solder balls 202 provided as external connection terminals on a motherboard 200.

The top surface of the topmost resin layer 104c of the interconnect board A carries the semiconductor chip 112 and is formed with bonding parts 116. The semiconductor chip 112 and bonding parts 116 are electrically connected by wires 114.

The bonding parts 116 on the top surface of the topmost resin layer 104c and the lands 110 on the bottom surface of the bottommost resin layer 104a are electrically connected through the interconnect pattern 118 formed on the top surface of the topmost resin layer 104c, vias 120 passing through the three resin layers 104a, 104b, and 104c, and an interconnect pattern 122 formed on the bottom surface of the bottommost resin layer 104a. Parts of the interconnect patterns 106a and 106b at the stacking interfaces are electrically connected to the vias 120.

The semiconductor chip 112 and wires 114 carried on the top surface of the topmost resin layer 104c are sealed by a sealing resin 130.

When the multilayer semiconductor device 100 is exposed to a thermal cycle in the state mounted on the motherboard 200 (large temperature rise or temperature fall cycle or small temperature rise/temperature fall cycle repeated), the heat stress occurring due to the difference in heat expansion coefficients between the multilayer semiconductor device 100 and the motherboard 200 is received by the solder balls 202. This stress acts on the bonding interface between the solder balls 202 and the lands 110 and sometimes causes cracks 300 from the vicinity of the lands 110 in the bottommost resin layer 104a.

The cracks 300 further advance in the bottommost resin layer 104a and sometimes cut the interconnect pattern 106a formed at the stacking interface X between the bottommost resin layer 104a and the directly higher resin layer 104b to cause electrical defects.

The occurrence of cracks 300 arising due to the heat stress is extremely difficult to prevent so long as there is a difference in heat expansion coefficients between the multilayer semiconductor device 100 and the motherboard 200. It is also extremely difficult to eliminate the above difference in heat expansion coefficients.

SUMMARY OF THE INVENTION

An object of the present invention is to provide a multilayer interconnect board and a multilayer semiconductor device not suffering from electrical defects due to disconnection of interconnect patterns due to cracks occurring from nearby lands of a bottommost resin layer of a multilayer semiconductor device when a multilayer semiconductor device using a multilayer interconnect board comprised of a plurality of stacked cloth-reinforced resin layers is mounted on a motherboard and exposed to a thermal cycle—even when the cracks pass through the bottommost resin layer and reach the directly higher resin layer.

According to a first aspect of the present invention, there is provided a multilayer interconnect board comprised of a plurality of stacked cloth-reinforced resin layers with at least one layer of interconnect patterns formed at a stacking interface of the resin layers, wherein an interconnect pattern is formed at a stacking interface between a bottommost resin layer provided at its bottom surface with lands for bonding with external connection terminals and a directly higher resin layer while avoiding portions corresponding to the lands.

According to a second aspect of the present invention, there is provided a multilayer interconnect board comprised of a plurality of stacked cloth-reinforced resin layers with at least one layer of interconnect patterns formed at a stacking interface of the resin layers, wherein a full surface interconnect pattern is formed over substantially the entire surface of a stacking interface between a bottommost resin layer provided at its bottom surface with lands for bonding with external connection terminals and a directly higher resin layer.

According to a third aspect of the present invention, there is provided a multilayer interconnect board comprised of a plurality of stacked cloth-reinforced resin layers with at least one layer of interconnect patterns formed at a stacking interface of the resin layers, wherein no interconnect pattern is formed at a stacking interface between a bottommost resin layer provided at its bottom surface with lands for bonding with other external connection terminals and a directly higher resin layer.

According to a fourth aspect of the present invention, there is provided a multilayer semiconductor device comprised of such a multilayer interconnect board and a semiconductor chip carried on the same.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 7:
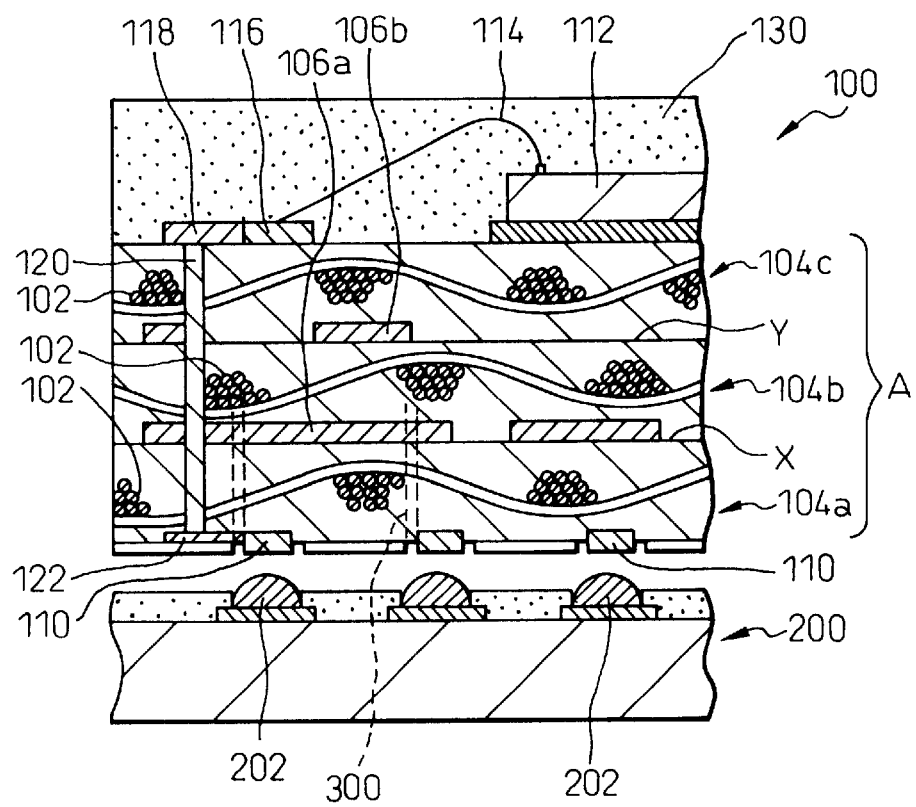
FIG. 7 is a partial sectional view of a multilayer semiconductor device of the related art.

The inventors first mounted the multilayer semiconductor device 100 shown in FIG. 7 on a motherboard 200 and applied a thermal cycle to observe cracks 300 occurring near the lands 110 and as a result discovered that the cracks 300 pass through the bottommost resin layer 104a on which the lands 110 are formed to cut the interconnect pattern 106a and reach even the resin layer 104b directly above the resin layer 104a, but remain in the resin layer 104b and do not reach the resin layer 104c further above that.

Figure 8:
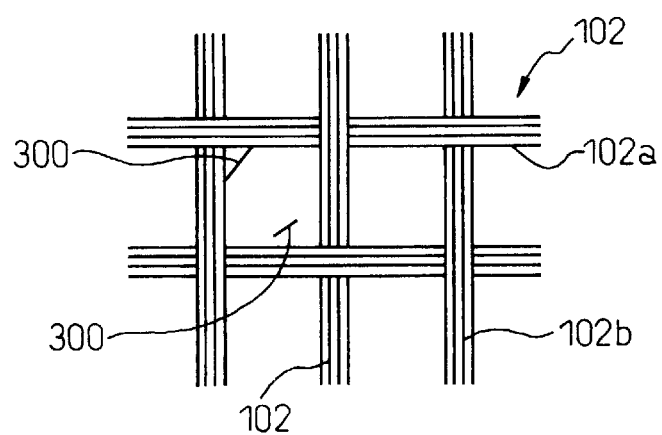
FIG. 8 is a plan view of the relationship between cracks occurring in a multilayer semiconductor device and a cloth-like reinforcing material.

Further, they discovered that the cracks 300 occurring near the lands 110 of the bottommost resin layer 104a only spread within regions surrounded by the wefts 102a and warps 102b forming the glass cloth 102 as shown in FIG. 8 and do not spread over the wefts 102a or warps 102b, that is, that they are limited to near the lands 110.

The present invention is based on these new discoveries. That is, to prevent the occurrence of electrical defects due to disconnection caused by cracks 300, either (1) the interconnect pattern 106a is provided while avoiding the range where the cracks 300 reach at the stacking interface X, (2) an interconnect pattern 106a of a form which is not electrically affected by any disconnection of the interconnect pattern 106a due to cracks 300 is provided, or (3) no interconnect pattern 106a is provided at the stacking interface X.

The multilayer interconnect board according to the first aspect of the present invention is a multilayer interconnect board comprised of a plurality of stacked cloth-reinforced resin layers with at least one layer of interconnect patterns formed at a stacking interface of the resin layers, wherein an interconnect pattern is formed at a stacking interface between a bottommost resin layer provided at its bottom surface with lands for bonding with solder balls or other external connection terminals and a directly higher resin layer while avoiding portions corresponding to the lands.

Since the interconnect pattern is formed avoiding portions corresponding to the lands at the stacking interface of the bottommost resin layer provided with the lands and the directly higher resin layer, even if cracks occurring near the lands in the bottommost resin layer advance into the directly higher resin layer, there will be no disconnections of the interconnect pattern due to the cracks.

The multilayer interconnect board according to a second aspect of the present invention is a multilayer interconnect board comprised of a plurality of stacked cloth-reinforced resin layers with at least one layer of interconnect patterns formed at a stacking interface of the resin layers, wherein a full surface interconnect pattern is formed over substantially the entire surface of the stacking interface between a bottommost resin layer provided at its bottom surface with lands for bonding with solder balls or other external connection terminals and a directly higher resin layer.

The interconnect pattern provided at the stacking interface between the bottommost resin layer provided with the lands and the directly higher resin layer extends over substantially the entire surface of the stacking interface and exceeds the range which the cracks reach. Therefore, the cracks only cut parts of the interconnect pattern and the required conduction is maintained by the remaining portions of the interconnect pattern, so no electrical defects arise.

The full surface interconnect pattern can be effectively used in particular as a power source pattern or a ground pattern.

The multilayer interconnect board according to a third aspect of the present invention is a multilayer interconnect board comprised of a plurality of stacked cloth-reinforced resin layers with at least one layer of interconnect patterns formed at a stacking interface of the resin layers, wherein no interconnect pattern is formed at a stacking interface between a bottommost resin layer provided at its bottom surface with lands for bonding with solder balls or other external connection terminals and a directly higher resin layer.

The cracks occurring at the bottommost resin layer provided with the lands advance inside the directly higher resin layer, but stop in that directly higher resin layer and do not advance into the further higher resin layers. Therefore, only the interconnect pattern provided at the stacking interface of the bottommost resin layer and directly higher resin layer are affected by the cracks. The interconnect patterns provided at the higher stacking interface are not affected by the cracks. Therefore, if no interconnect pattern is provided at the stacking interface between the bottommost resin layer and the directly higher resin layer, there is no effect on the interconnect patterns due to the cracks.

The present invention further provides a multilayer semiconductor device comprised of such a multilayer interconnect board and a semiconductor chip carried on the same.

The present invention results in particularly remarkable effects if applied to a multilayer interconnect board or multilayer semiconductor device of a land grid array (LGA) structure where lands are formed in openings in an insulating layer formed at the bottom surface of the bottommost layer and the outer wall surface of the lands and inner wall surface of the openings are separated by a gap.

Preferred embodiments of the present invention will be described in detail below while referring to the attached figures.

Figure 1:
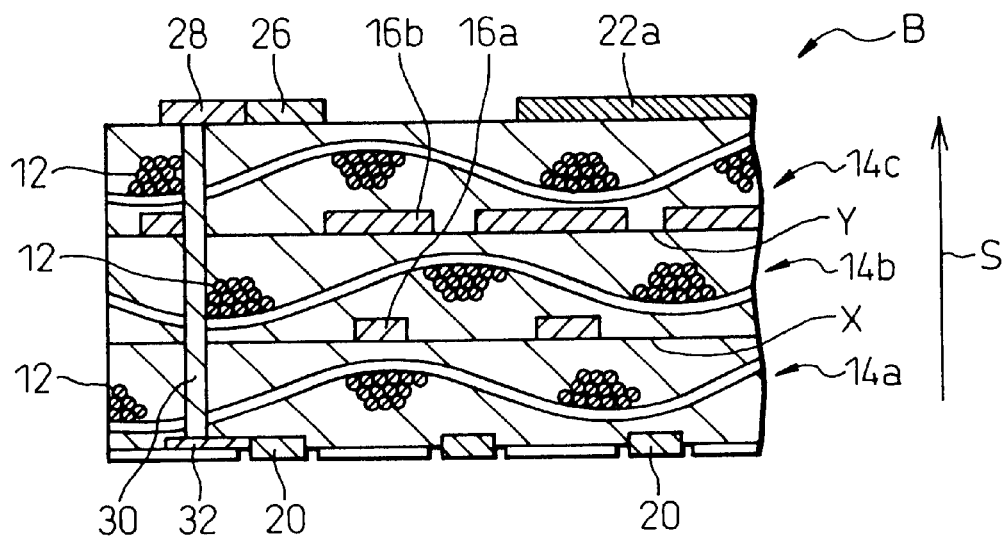
FIG. 1 is a partial sectional view of a multilayer interconnect board according to an embodiment of the present invention.

FIG. 1 is a partial sectional view of a multilayer interconnect board B according to an embodiment of the present invention. It is formed by three resins layers 14a, 14b, and 14c reinforced by glass cloth 12 as a reinforcing material. Interconnect patterns 16a and 16b are formed at the stacking interface x between the bottommost resin layer 14a and the directly higher resin layer 14b and the stacking interface Y between the resin layer 14b and topmost resin layer 14c.

The bottommost resin layer 14a is formed on its bottom surface with lands 20 for bonding with solder balls 202 serving as external connection terminals of a motherboard 200 shown in FIG. 7.

The topmost resin layer 14c is formed on its top surface with a pad 22a for carrying a semiconductor chip and with bonding parts 26. As explained later, the semiconductor chip carried on the pad 22 is electrically connected to the bonding parts 26 by wires.

The bonding parts 26 and the lands 20 are electrically connected through an interconnect pattern 28 formed on the top surface of the topmost resin layer 14c, vias 30 passing through the resin layers 14a, 14b, and 14c, and an interconnect pattern 32 formed on the bottom surface of the resin layer 14a. Parts of the interconnect patterns 16a and 16b are also connected to the vias 30.

Figure 2:
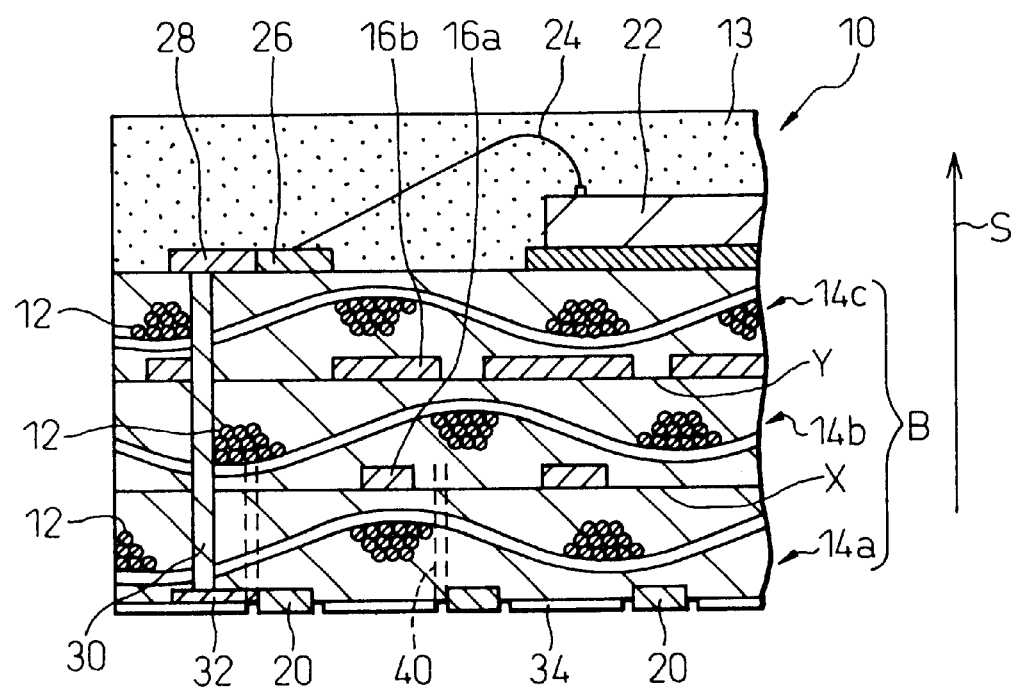
FIG. 2 is a partial sectional view of a multilayer semiconductor device using the multilayer interconnect board shown in FIG. 1.

A multilayer semiconductor device comprised of the multilayer interconnect board B of FIG. 1 carrying a semiconductor chip is shown in FIG. 2. In the multilayer semiconductor device 10, the semiconductor chip 22 carried on a pad 22a of the multilayer interconnect board B and the bonding parts 26 are connected by wires 24. The semiconductor chip 22 and wires 24 are sealed by a sealing resin layer 13.

In the multilayer interconnect board B shown in FIG. 1 and FIG. 2, the interconnect pattern 16a formed at the stacking interface X of the bottommost resin layer 14a and the directly higher resin layer 14b is formed while avoiding the portions corresponding to the lands 20. That is, the interconnect pattern 16a and the lands 20 are arranged at positions not overlapping with each other in the plan view seen from the stacking direction S.

Figure 3:
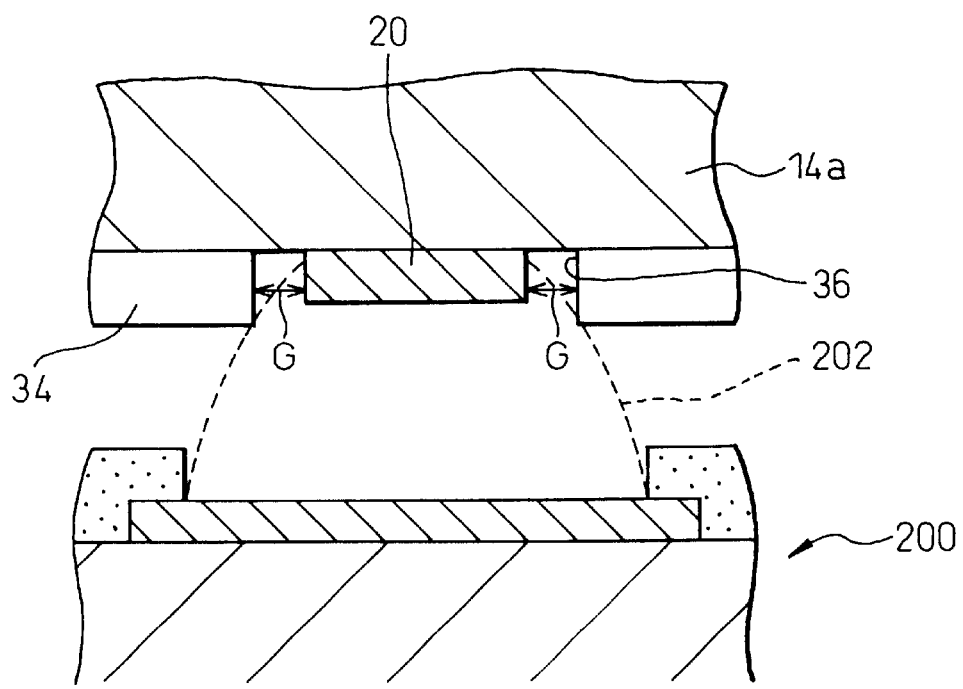
FIG. 3 is a partial sectional view of a land grid away (LGA) structure.

FIG. 3 shows the relationship between a land 20 of the multilayer interconnect board B and a motherboard 200. The bottom surface of the bottommost resin layer 14a is formed with an insulating layer 34 comprised of a solder resist. The land 20 is formed in an opening 36 of the insulating layer 34. A gap G is present between the outer wall surface of the land 20 and the inner wall surface of the opening 36 of the insulating layer 34. This corresponds typically to an LGA structure.

In this LGA structure, when the solder ball 202 of the external connection terminal of the motherboard 200 is bonded to the land 20 of the semiconductor device 10, the two are closely bonded by the solder ball 202 engulfing the land 20. On the other hand, when there is a gap G, the solder ball 202 does not closely bond with the inner wall surface of the opening 36 of the insulating layer 34.

Therefore, if the semiconductor device 10 is exposed to a thermal cycle in the state mounted on the motherboard 200, the stress due to the difference in the heat expansion coefficients between the semiconductor device 10 and motherboard 200 will concentrate at the joints between the lands 20 and the solder balls 202 and cracks 40 will easily occur near the lands 20 as shown in FIG. 2.

The cracks 40, as shown in FIG. 8, pass through the bottommost resin layer 14a and reach the inside of the directly higher resin layer 14b while being limited to the ranges enclosed by the wefts and warps forming the glass cloth 12, that is, near the vicinities of the lands 20.

However, the interconnect pattern 16a at the stacking interface X between the resin layer 14a and resin layer 14b is formed avoiding portions corresponding to the lands 20 where the cracks 40 may advance to.

Therefore, even if the cracks 40 advance to the stacking interface X between the resin layer 14a and the resin layer 14b, the interconnect pattern 16a will not be disconnected and electrical defects caused by the cracks 40 will not be caused.

Figure 4:
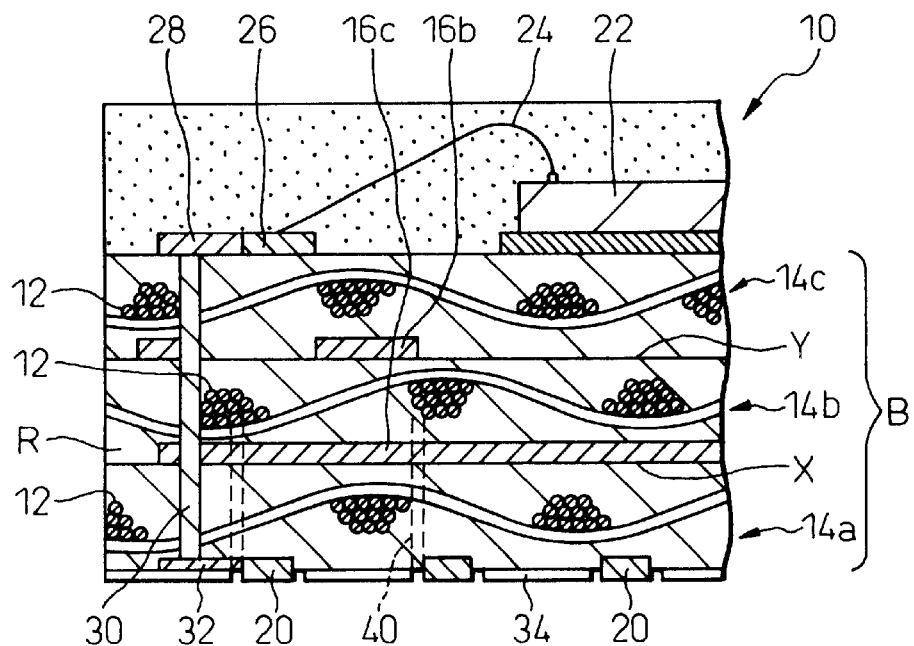
FIG. 4 is a partial sectional view of a multilayer semiconductor device according to another embodiment of the present invention.

FIG. 4 is a partial sectional view of a semiconductor device using the multilayer interconnect board B according to another embodiment of the present invention. A full surface interconnect pattern 16c covering substantially the entire surface of the stacking interface X is formed at the stacking interface X of the bottommost resin layer 14a and the directly higher resin layer 14b. When cracks 40 occurring in the vicinity of the lands 20 pass through the bottommost resin layer 14a and reach inside the directly higher resin layer 14b, even if parts of the full surface interconnect pattern 16c are disconnected by the cracks 40, the full surface pattern 16c is not disconnected as a whole and no electrical defects occur.

The full surface pattern 16c is preferably used as a power source pattern or a ground pattern.

Note that "substantially the entire surface", as shown in FIG. 4, means allowing some blank portion R in the full surface interconnect pattern 16c at the left end of the multilayer interconnect board B and the formation of through holes through which the vias 30 can pass without contact.

Figure 5:
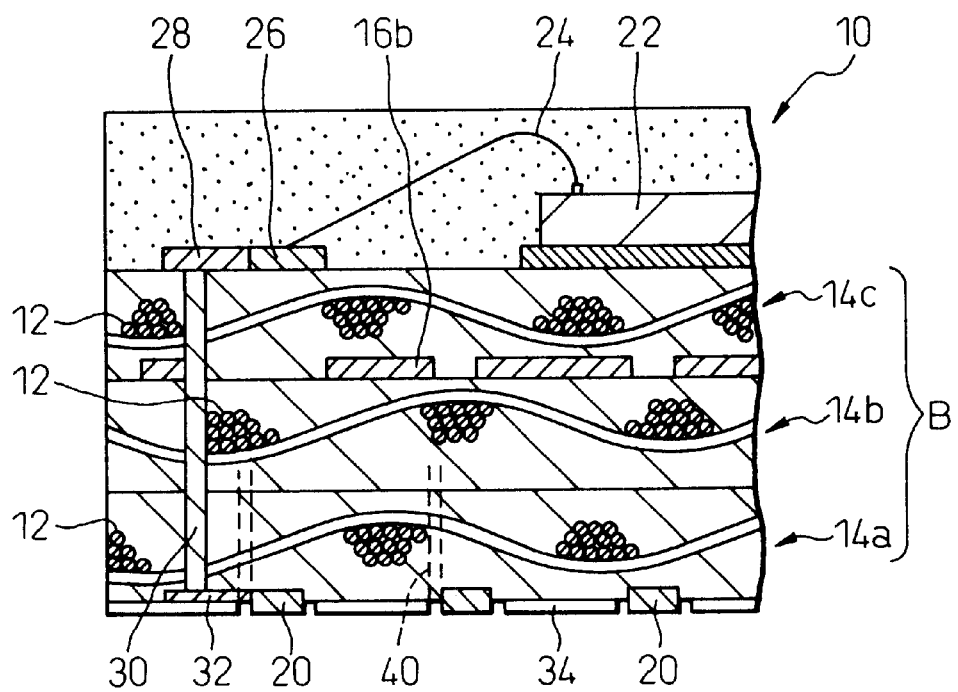
FIG. 5 is a partial sectional view of a multilayer semiconductor device according to still another embodiment of the present invention.

FIG. 5 is a partial sectional view of a semiconductor device using a multilayer interconnect board B according to still another embodiment of the present invention. In this embodiment, no interconnect pattern is formed at the stacking interface X between the bottommost resin layer 14a and the directly higher resin layer 14b.

As already explained, the cracks 40 occurring near the lands 20 pass through the bottommost resin layer 14a and reach inside the directly higher resin layer 14b, but do not pass through the resin layer 14b. Therefore, the interconnect pattern 16b formed at the stacking interface Y of the resin layer 14b and the further higher resin layer 14c is never disconnected by the cracks 40. When it is possible to form the interconnect pattern 16b at a high density at the stacking interface Y, no interconnect pattern is formed at the stacking interface X between the bottommost resin layer 14a and the directly higher resin layer 14b.

In this way, it is also possible to eliminate electrical defects arising due to disconnection of the interconnect pattern due to cracks 40 occurring near the lands 20 by not forming the interconnect pattern at the stacking interface X of the bottommost resin layer 14a and the directly higher resin layer 14b.

The multilayer interconnect board B shown in FIG. 1 to FIG. 5 may be obtained by similar steps as an ordinary multilayer interconnect board using a plurality of resin boards reinforced by glass cloth 12 as a cloth reinforcing material.

That is, interconnect patterns 16a, 16b, . . . are formed at predetermined surfaces of the plurality of resin boards having copper foil bonded to one or both surfaces, then prepregs comprised of glass cloth impregnated with a resin (resin same as resin of resin boards) serving as a bonding material are placed on the interconnect pattern forming surfaces of the resin plates, then these are heated and pressed to bond and form a multilayer board. At that time, resin boards not formed with patterns are stacked at the topmost layer and bottommost layer of the multilayer board. That is, the top surface and bottom surface of the multilayer board are covered on their entire surfaces with not patterned copper foil.

Next, via holes are formed by a drill at predetermined locations of the multilayer board, the entire surface of the stack, including the inner wall surfaces of the via holes, are electrolessly copper plated and electrolytically copper plated to form vias 30 etc., then the copper foil of the top surface and bottom surface of the multilayer board are etched to form the bonding parts 26 or lands 20.

Next, the top surface and the bottom surface of the multilayer board are coated with a solder resist to form insulating layers 34 (not shown on the top surface) and thereby complete the multilayer interconnect board B.

The multilayer interconnect board B of the present invention shown in FIG. 1 to FIG. 5 and the multilayer semiconductor device 10 using this multilayer interconnect board B are of LGA structures. The present invention, however, is not limited to these. For example, the present invention may also be applied to a multilayer interconnect board of a BGA structure shown in FIG. 6 and a semiconductor device using the same.

Figure 6:
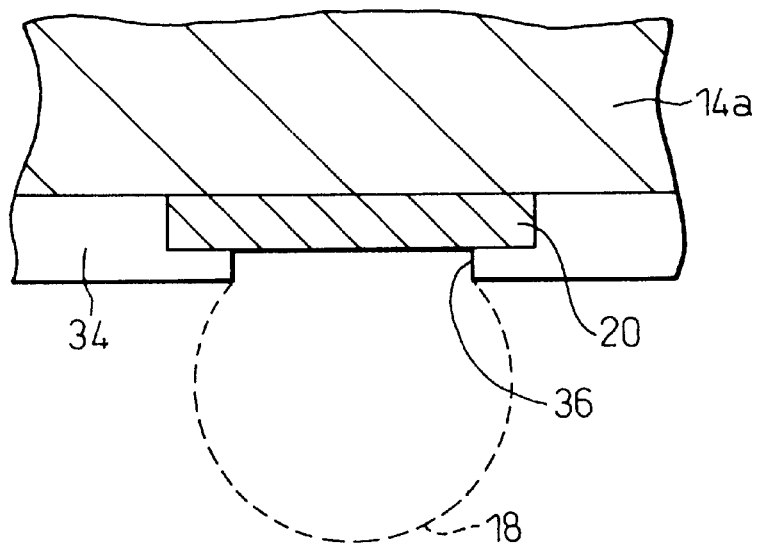
FIG. 6 is a partial sectional view of a ball grid array (BGA) structure.

In the BGA structure shown in FIG. 6, the lands 20 formed on the bottom surface of the bottommost resin layer 14a are embedded in the insulating layer 34 formed by coating the solder resist on the lower surface in the same way. The bottom surfaces of the lands 20 are exposed through the openings 36 of the insulating layer 34.

In the BGA structure, the solder balls 18 serving as the external connection terminals are formed by placing solder balls on the exposed surfaces of the lands 20 in the insulating layer openings 36 and reflowing them, so are also closely bonded with the inner wall surfaces of the openings formed in the insulating layer 34. Therefore, it is possible to disperse the stress given to the solder balls 18 compared with the LGA structure.

In this way, the BGA structure has little risk of occurrence of cracks near the lands 20 compared with the LGA structure. If the present invention is applied, however, it is possible to secure an effect of prevention of electrical defects due to disconnection in the case of occurrence of cracks, so the reliability of the multilayer interconnect board and the semiconductor device using the same can be further improved.

EXAMPLE

Next, the present invention will be explained in further detail by an example.

Two resin boards having copper foil bonded to their two surfaces and one prepreg comprised of glass cloth impregnated with a resin as an adhesive were used.

The copper foil of one side of each resin board was etched to form the interconnect patterns 16a and 16b, then the prepreg comprised of the glass cloth impregnated with a resin as an adhesive was inserted between the two resin boards with their interconnect pattern forming surfaces facing each other to obtain a stack. This stack was heated and pressed to bond it, whereby a multilayer board covered with copper foil on its entire top surface and bottom surface was obtained.

Next, via holes were made in predetermined locations of the multilayer board by a drill, the entire surface of the stack including the inner wall surfaces of the via holes was electrolessly copper plated and electrolytically copper plated to form the vias 30, then the copper foils etc. of the top surface and bottom surface of the multilayer substrate were etched to form the bonding parts 26 or lands 20.

After this, a solder resist was coated on the bottom surface and top surface of the multilayer board to form the insulating layers 34 and thereby form the multilayer interconnect board B of a thickness of 0.36 mm shown in FIG. 1.

Next, two semiconductor chips 22, 22 were placed on the top surface of the multilayer interconnect board B, then the semiconductor chips 22, 22 were connected by wires 24 to the bonding parts 26.

Further, the semiconductor chips 22, 22, wires 24, etc. were sealed by a sealing resin 13 to obtain the multilayer semiconductor device 10 shown in FIG. 2.

The multilayer semiconductor device 10 was formed with the interconnect patterns 16a and 16b at the stacking interface X between the bottommost resin layer 14 formed with the lands 20 and the intermediate resin layer 14b and the stacking interface Y between the intermediate resin layer 14b and the topmost resin layer 14c while avoiding the portions corresponding to the lands 20.

The multilayer semiconductor device 10 obtained above was mounted on a motherboard 200 comprised of four stacked resin boards of 1.2 mm thicknesses. At that time, the plurality of solder balls 202 mounted on the motherboard 200 were bonded with the corresponding plurality of lands 20 of the multilayer semiconductor device 10.

The multilayer semiconductor device 10 was subjected to a thermal cycle test in the state mounted on a motherboard 200. In this thermal cycle test, the sample was alternately exposed to an ambient temperature of −25° C. and an ambient temperature of +125° C. as one cycle. This thermal cycle test was performed on 50 such multilayer semiconductor devices to investigate the number of multilayer semiconductor devices suffering from electrical defects. The results are shown in Table 1.

TABLE 1

| No. of thermal cycles | 250 | 500 | 750 | 1000 |
|---|---|---|---|---|
| No. of defects | 0 | 0 | 0 | 0 |

As clear from Table 1, no electrical defects occurred in any of the multilayer semiconductor devices. After the thermal cycle test, a plurality of randomly selected multilayer semiconductor devices were taken apart and observed near their lands, whereupon cracks were found to have occurred and passed through the bottommost resin layer 14a, but there was almost no disconnection of the interconnect patterns.

COMPARATIVE EXAMPLE

The same procedure was followed as in the Example to obtain a multilayer semiconductor device except for forming an interconnect pattern including also portions corresponding to the lands at the stacking interface between the bottommost resin layer formed with the lands and the directly higher resin layer.

This multilayer semiconductor device was subjected to a thermal cycle test in the same way as the example. The results are shown in the following Table 2.

TABLE 2

| No. of thermal cycles | 250 | 500 | 750 | 1000 |
|---|---|---|---|---|
| No. of defects | 7 | 30 | 45 | 48 |

As clear from Table 2, electrical defects occurred in a large number of multilayer semiconductor devices. In the multilayer semiconductor devices where the electrical defects occurred, the cracks occurring from near the lands passed through the bottommost resin layer having the lands and cut the interconnect pattern at the stacking interface between the bottommost resin layer and the directly higher resin layer while being limited to within the ranges enclosed by the wefts and warps forming the glass cloth.

Summarizing the effects of the invention, as explained above, the multilayer semiconductor device using the multilayer interconnect board of the present invention does not suffer from electrical defects arising due to disconnection of the interconnect patterns due to cracks occurring near the lands of the multilayer semiconductor device when exposed to a thermal cycle in the state mounted on a motherboard even when the cracks pass through the bottommost resin layer and reach the directly higher resin layer, so the reliability of the multilayer semiconductor device can be improved.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-299022, filed on Sep. 28, 2001, the disclosure of which is expressly incorporated herein by reference in its entirety.

What is claimed is:

1. A multilayer interconnect board comprised of a plurality of stacked cloth-reinforced resin layers with at least one layer of interconnect patterns formed at a stacking interface of the resin layers, wherein an interconnect pattern is formed at a stacking interface between a bottommost resin layer provided at its bottom surface with lands for bonding with external connection terminals and a directly higher resin layer while avoiding portions corresponding to the lands.

2. A multilayer interconnect board comprised of a plurality of stacked cloth-reinforced resin layers with at least one layer of interconnect patterns formed at a stacking interface of the resin layers, wherein a full surface interconnect pattern is formed over substantially the entire surface of a stacking interface between a bottommost resin layer provided at its bottom surface with lands for bonding with external connection terminals and a directly higher resin layer.

3. A multilayer interconnect board as set forth in claim 2, wherein said full surface interconnect pattern is a power source pattern or a ground pattern.

4. A multilayer interconnect board comprised of a plurality of stacked cloth-reinforced resin layers with at least one layer of interconnect patterns formed at a stacking interface of the resin layers, wherein no interconnect pattern is formed at a stacking interface between a bottommost resin layer provided at its bottom surface with lands for bonding with external connection terminals and a directly higher resin layer.

5. A multilayer interconnect board as set forth in claim 1, wherein said lands are formed in openings of an insulating layer formed at a bottom surface of said bottommost resin layer and wherein there is a gap between outer wall surfaces of said lands and inner wall surfaces of said openings.

6. A multilayer semiconductor device comprised of a multilayer interconnect board as set forth in claim 1 and a semiconductor chip carried on the same.

7. A multilayer interconnect board as set forth in claim 2, wherein said lands are formed in openings of an insulating layer formed at a bottom surface of said bottommost resin layer and wherein there is a gap between outer wall surfaces of said lands and inner wall surfaces of said openings.

8. A multilayer interconnect board as set forth in claim 3, wherein said lands are formed in openings of an insulating layer formed at a bottom surface of said bottommost resin layer and wherein there is a gap between outer wall surfaces of said lands and inner wall surfaces of said openings.

9. A multilayer interconnect board as set forth in claim 4, wherein said lands are formed in openings of an insulating layer formed at a bottom surface of said bottommost resin layer and wherein there is a gap between outer wall surfaces of said lands and inner wall surfaces of said openings.

10. A multilayer semiconductor device comprised of a multilayer interconnect board as set forth in claim 2 and a semiconductor chip carried on the same.

11. A multilayer semiconductor device comprised of a multilayer interconnect board as set forth in claim 4 and a semiconductor chip carried on the same.

* * * * *

UNITED STATES PATENT AND TRADEMARK OFFICE
CERTIFICATE OF CORRECTION

PATENT NO. : 6,657,295 B2
DATED : December 2, 2003
INVENTOR(S) : Yasushi Araki

It is certified that error appears in the above-identified patent and that said Letters Patent is hereby corrected as shown below:

Column 4,
Line 55, change "interface x" to -- interface X --.

Column 8,
Line 1, change "14" to -- 14a --.

Signed and Sealed this

First Day of June, 2004

JON W. DUDAS
*Acting Director of the United States Patent and Trademark Office*